(12) United States Patent
Wang et al.

(10) Patent No.: US 11,201,611 B2
(45) Date of Patent: Dec. 14, 2021

(54) DUTY CYCLE CONTROL CIRCUITRY FOR INPUT/OUTPUT (I/O) MARGIN CONTROL

(71) Applicant: Intel Corporation, Santa Clara, CA (US)

(72) Inventors: Guan Wang, San Jose, CA (US); Qiang Tang, Cupertino, CA (US); Agatino Massimo Maccarrone, Regalbuto (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/218,053

(22) Filed: Dec. 12, 2018

(65) Prior Publication Data

US 2020/0195239 A1    Jun. 18, 2020

(51) Int. Cl.
*H03K 5/156* (2006.01)
*H03K 5/135* (2006.01)
*H03K 3/017* (2006.01)
*H03K 5/131* (2014.01)

(52) U.S. Cl.
CPC ......... *H03K 5/1565* (2013.01); *H03K 3/017* (2013.01); *H03K 5/131* (2013.01); *H03K 5/135* (2013.01)

(58) Field of Classification Search
CPC ........ H03K 5/131; H03K 5/133; H03K 5/134; H03K 5/135; H03K 5/14; H03K 5/145; H03K 5/156; H03K 5/1565; H03K 3/01; H03K 3/017
USPC .................................................. 327/172, 175
See application file for complete search history.

(56) References Cited

U.S. PATENT DOCUMENTS

| | | | |
|---|---|---|---|
| 2004/0064749 A1* | 4/2004 | Grossnickle | H03K 5/133 713/400 |
| 2014/0006808 A1 | 1/2014 | Sizikov et al. | |
| 2014/0375363 A1* | 12/2014 | Chen | H03L 7/18 327/115 |
| 2015/0069995 A1 | 3/2015 | Schrom et al. | |
| 2015/0244353 A1 | 8/2015 | Humphrey et al. | |
| 2016/0266174 A1* | 9/2016 | Choi | H03K 3/0315 |
| 2020/0159278 A1 | 5/2020 | Pereira et al. | |

* cited by examiner

*Primary Examiner* — Diana J. Cheng
(74) *Attorney, Agent, or Firm* — Compass IP Law PC

(57) ABSTRACT

An input/output (I/O) circuit provides a direct current (DC) bias between I/O stages to control duty cycle of the I/O. The I/O circuit can include one or more predriver stages and one or more output stages. The predriver stages can collectively be referred to as a predriver stage, and the output stages can collectively be referred to an output stage. The output stage for a transmitter drives the signal line. The output stage for an input buffer provides a receive signal for processing by the receiver. The I/O circuit includes a control circuit to control the DC bias between the stages to provide trim adjustment of a duty cycle for the output stage.

20 Claims, 9 Drawing Sheets

DUTY CYCLE CONTROL CIRCUITRY FOR INPUT/OUTPUT (I/O) MARGIN CONTROL

FIELD

Descriptions are generally related to digital input/output (I/O), and more particular descriptions are related to digital signal phase compensation.

BACKGROUND

The signaling in a high speed clock path or a high speed data path is subject to duty cycle distortion due to process variations, operational variations, and system noise. The duty cycle distortion of the signaling can cause the signal edges to be non-aligned with the sampling of the signal, resulting in signaling errors. Because of the potential for duty cycle distortion, input/output (I/O) traditionally includes trim circuitry to adjust the specific application of driver or buffer settings to the I/O. Such trim adjustments can be part of calibration procedures. The calibration sets the I/O settings that will result in the best signaling.

One traditional trim adjustment involves duty cycle trim circuitry directly in the high speed path. However, the additional circuitry introduces other issues or impacts into the signal path, such as more delay and noise, or a new bottom neck of frequency limitation. It is also possible that the performance of the trim circuitry itself may not be satisfactory. For example, the inline trim circuitry may introduce poor linearity.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
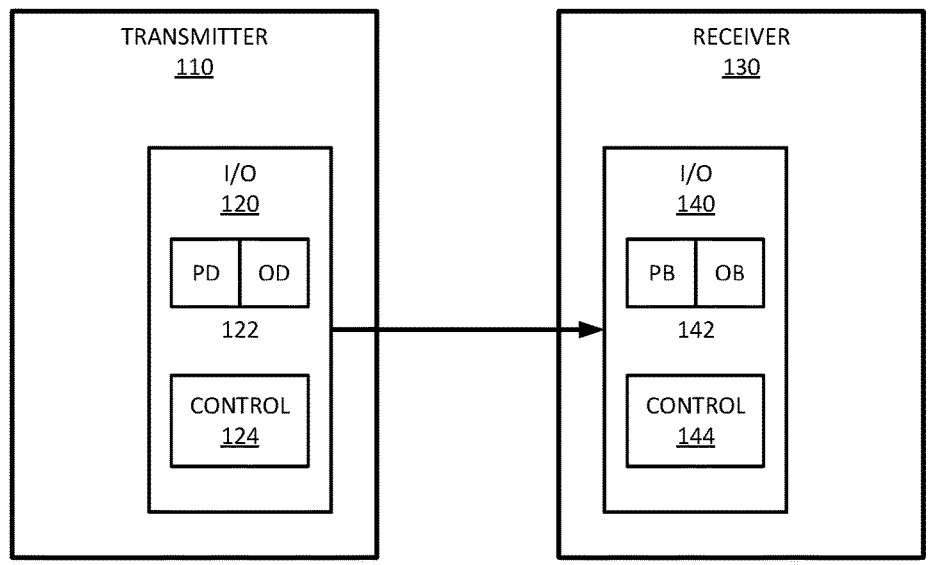
FIG. 1 is a block diagram of an example of a system with duty cycle control circuitry to provide I/O (input/output) trim.

Descriptions of certain details and implementations follow, including non-limiting descriptions of the figures, which may depict some or all examples, and well as other potential implementations.

DETAILED DESCRIPTION

As described herein, an input/output (I/O) circuit provides a direct current (DC) bias between I/O stages to control duty cycle of the I/O. The I/O can be for a high speed data path or a high speed clock or strobe path. The I/O circuit can include one or more predriver stages and one or more output stages. For simplicity, the descriptions typically refer to a predriver stage and an output stage, but it will be understood that multiple stages can be included. The output stage for a transmitter drives the signal line to send signals to a receiver. The output stage for an input buffer generates a receive signal for processing at the receiver.

The I/O circuit includes a control circuit to control the DC bias between the input and output stages to provide trim adjustment of a duty cycle for the output stage. The trim adjustment can align the output signal with a clock or strobe signal for a transmitter. The trim adjustment can align the buffer output with a clock or strobe signal for sampling for a receiver. While traditional trim adjustment includes duty cycle control directly in the high speed path, the trim adjustment herein provides bias adjustment at the connection between the predriver stage and the output stage. The bias adjustment at the connection allows for correction of the duty cycle of the signal at the output stage without needing to introduce inline circuitry. In one example, the bias adjustment provided herein can be used in conjunction with inline trim adjustment circuitry. Rather than being inline, the adjustment circuitry herein is indirect as it provides a DC bias into the node without directly amplifying or redriving the signal. In such an implementation, the bias adjustment can adjust for nonlinearity or offset caused by inline duty cycle control circuitry.

In one example, the adjustment circuitry adjusts the duty cycle of the signal at the output of an amplifier or comparator of the predriver stage to control the output stage amplifier or driver. In one example, the adjustment circuitry adjusts the duty cycle with a biasing current on the connection between the predriver and output stages, to bias the input node of the output stage. The biasing current can adjust the general voltage level of the node, which shifts the signal up or down, which adjusts where the input signal crosses the digital signal transition. Adjusting the voltage reference crossing point in turn adjusts digital signal transition timing and hence adjusts the signal duty cycle.

Adjustment of the bias at the connection node has minimum impact on the main signal path. The adjustment can be made without inserting additional circuitry in the high speed path or additional stages in the path. In one example, a junction capacitor at a tapping potentiometer of the predriver can be relatively small due to the control of biasing current at the node between the predriver and the output stage. One example of bias control at the connection between the predriver and the output stage introduces nearly zero additional delay and only a small amount of noise. One example of the bias control at the connection node maintains the same highest operating frequency as the system would have without the addition of the trim circuitry.

In one example, the trim range and trim resolution has high controllability. With the use of a current source responsive to a bias voltage, there is a good response between bias voltage and the current. The current can then be tightly controlled to provide good resolution of voltage offset on the connection between the stages. In one example, with the use of a transistor circuit or current source, the trim adjustment current can be easily manipulated when there is good control over the driving voltage. Good control over the bias provides good trim linearity, which can guarantee monotonic function of duty cycle trim.

One example of the trim adjustment or trim control circuitry can be a simple current switch, controllable to drive more or less current in response to a control voltage. It will be understood that more complex designs can be used, with one or more current sources, current mirrors to respond to feedback from a later part of the circuit or feedforward from a previous stage, or other circuitry, or a combination of these. Thus, the trim adjustment herein can provide good design flexibility. In one example, the trim adjustment can respond to feedback from a later point of the clock path or data path to provide calibration. In one example, the trim adjustment includes a current mirror, which provide an output current Iout=Iref*trim_Factor, which provides good trim linearity as long as there is sufficient calibration range.

FIG. 1 is a block diagram of an example of a system with duty cycle control circuitry to provide I/O (input/output) trim. System 100 represents a system in which duty cycle control can be applied to either transmitter I/O 120 or to receiver I/O 140, or to both transmitter I/O 120 and receiver I/O 140. Application of duty cycle control to I/O can be understood as the application of settings to the hardware components of the I/O interface. The settings configure the operation of the hardware components, such as control over the timing, control over slew rate, control over voltage, or other settings. The trim control can provide adjustment to one or more of the settings.

Transmitter 110 represents any component or chip in system 100 that transmits a high speed signal to receiver 130. Likewise, receiver 130 represents any component or chip in system 100 that receives a high speed signal from a transmitter. The high speed signal represents any transfer of data or control signal that typically uses calibration or trim control to control or set one or more I/O settings for the data transfer. A more specific example of high speed data can include data associated with a memory subsystem (e.g., between the memory controller and the memory device). Another specific example of high speed data can include data associated with a video system, such as between a graphics processor and graphics memory, or graphics processor and display, or some other combination in a video subsystem. A high speed system can include the transfer of data and a clock or timing signal. In one example, the transmitter and receiver are components of a NAND (Not AND) storage system. NAND storage refers to a storage technology that stores data in NAND-based bitcells, and is a technology commonly used in solid state drives (SSDs) and in platform configuration storage (such as on a flash storage device. For high speed signaling, a system typically adjusts the phase of the signals to align the signal and clock to ensure sampling on the strobe or clock signal.

I/O 120 of transmitter 110 includes driver circuitry 122. I/O 120 represents an I/O interface for transmitter 110, and includes a high speed path. Driver circuitry is illustrated as PD for the predriver and OD for the output driver. The driver stages of driver 122 can be referred to as one or more driver predriver stages and one or more driver output stages. Control 124 represents trim control circuitry as described herein to control the bias of a connection between the PD and OD. The bias controls the duty cycle of a signal sent from PD to OD. OD sends the signal from I/O 120 to I/O 140 of receiver 130. In one example, I/O 140 includes control circuitry to adjust the trim bias in the receiver buffer. In one example, I/O 120 includes trim bias control circuitry, and I/O 140 does not include trim bias control circuitry. In one example, I/O 120 does not include trim bias control circuitry, and I/O 140 includes trim bias control circuitry.

I/O 140 includes buffer circuitry 142. I/O 140 represents an I/O interface for transmitter 130, and includes a high speed path. Buffer circuitry is illustrated as PB for the buffer predriver and OB for the last stage buffer, or the "output buffer" referring to the buffer stage that provides the received signal for processing by processing components. The buffer stages of buffer 142 can be referred to as one or more buffer predriver stages and one or more input buffer output stages. The processing components can be or include a general purpose processor or microcontroller, or an application specific processor or signal processor. Control 144 represents trim control circuitry as described herein to control the bias of a connection between PB and OB. The bias controls the duty cycle of a signal sent from PB to OB.

Figure 2:
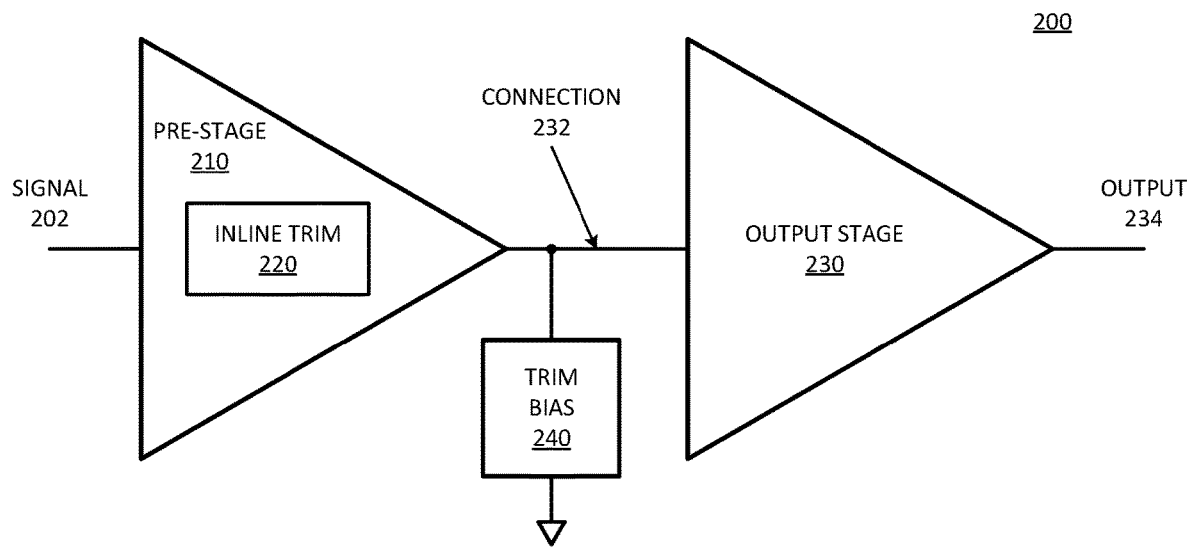
FIG. 2 is a block diagram of an example of a circuit to provide I/O (input/output) trim with a bias signal.

FIG. 2 is a block diagram of an example of a circuit to provide I/O (input/output) trim with a bias signal. System 200 provides one example of either driver I/O circuitry in accordance with driver circuitry 122 of system 100, or buffer I/O circuitry in accordance with buffer circuitry 142 of system 100. System 200 receives signal 202 and generates output 234. In one example, signal 202 represents a data signal. In one example, signal 202 represents a clock signal.

System 200 illustrates pre-stage 210 as one or more pre-output stages. Output stage 230 represents one or more stages of output. A "stage" can be understood generally as circuitry that operates together to produce an effect on an input. For example, an amplifier stage refers to circuitry that produces an amplified signal. The output of the stage is where the gain of an amplifier stage is measured, so an amplifier stage with a gain of 'A' refers to circuitry that operates together to generate an output of S*A, where S is the input signal. As another example, a comparator stage refers to circuitry that produces a binary output representative of the comparison between an input signal and a reference signal, or between two input signals.

Pre-stage 210 represents one or more predriver stages, or one or more pre-buffer stages. Output stage 230 represents one or more stages to generates an output signal. System 200 includes connection 232 coupling pre-stage 210 to output stage 230. Connection 232 represents one or more signal lines, and can include circuit elements that provide the coupling between the pre-output stages and the output stage. System 200 includes trim bias 240 to bias connection 232. In one example, trim bias 240 provides a current that controls the current or voltage level of connection 232. In one example, trim bias 240 provides a voltage to maintain a current or voltage level of connection 232.

In one example, trim bias 240 is responsive to a control signal (not explicitly shown). The control signal can be the trim. The trim represents a dynamic, adaptable setting to set a configuration for the I/O of output 234. The trim can be specific to a channel, specific to a signal line, specific to an operating mode, specific to a device, or some other system configuration or setting, or a combination of any of these. In one example, trim bias 240 control logic (not specifically illustrated in system 200) provides one or more control signals to affect the operation of trim bias 240. Trim bias 240 adjusts a DC bias of connection 232. Adjustment of the DC bias affects the baseline switching point of the AC signal. The switching point refers to a voltage level that represents a switch in digital value of the signal (i.e., 0->1 or 1>0). The switching point can be referred to as the transition threshold, referring to a threshold voltage at which a logic value is to be understood as having changed.

In one example, trim bias 240 adjusts the duty at output stage 230 with a biasing current to the input node at connection 232. The biasing current at the input node or at connection 232, can adjust the general voltage level of the node. In one example, system 200 includes inline trim bias circuitry in addition to trim bias 240. Inline trim 220 represents circuitry in one or more circuit stages represented by pre-stage 210. One traditional approach to duty cycle adjustment is to insert additional trim circuitry such as inline trim 220, which is right in the data path or clock path. Adjustment in the signal path refers to circuitry that adjusts the signal itself that effects the duty cycle change to the signal. In one example, adjustment of the DC bias offset of the signal into the output stage adjusts the logical transition threshold, which in turn adjusts the duty cycle of the output in response to the same input signal.

Figure 4:
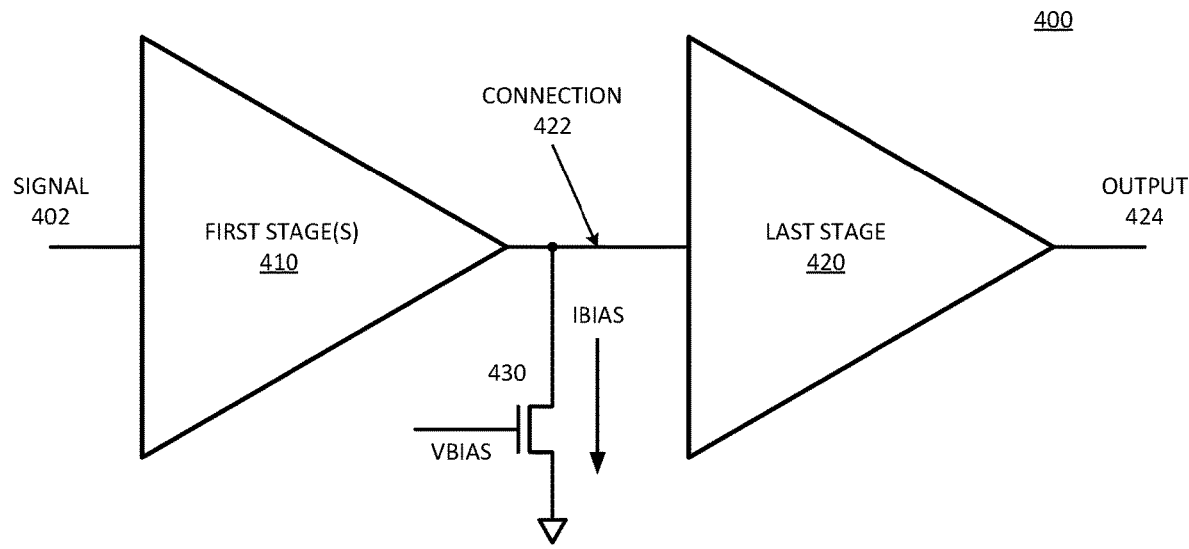
FIG. 4 is a block diagram of an example of a circuit to provide I/O (input/output) trim with a bias current.

In one example of system 200, rather than needing to set many signal values or different signals, trim bias 240 can operate in response to a bias signal (for example, see FIG. 4). In such an example, the trim can be carefully controlled in response to a bias signal. The control over the bias signal may be easier to control than controlling multiple signals for inline trim 220, permitting control over the precision of the trim. In one example, the control over trim bias 240 is an analog signal. As an analog signal, the trim bias can allow for different bias based on a magnitude of the bias signal (e.g., a higher current vs. a weaker current, or a higher voltage vs. a lower voltage). In one example, the control over trim bias 240 is a digital signal. For example, the digital signal could be used to select a multiplexer output. In another example, the digital control signal can be an input to a digital to analog conversion circuit. The use of a digital control signal can provide a determinate signal output to control the trim bias.

It will be understood that trim bias 240 is represented generically in system 200. Trim bias 240 can be implemented in a variety of different ways. Subsequent descriptions provide non-limiting examples. Trim bias 240 can itself be circuitry that has one or more stages or one or more levels of circuit control. In one example, trim bias 240 is a simple current control circuit. In one example, trim bias 240 has more complex logic or control circuitry to control the bias offset. For example, trim bias 240 can include a current switch with a simple multiplexer to choose between two fixed outputs to drive the current switch. Alternatively, a similar current switch could be controlled with 16 distinct levels of output, or over 100 different levels. In one example, trim bias 240 allows for feedback from output stage 230. In one example, trim bias 240 allows for feedforward control from pre-stage 210. Other configurations are possible.

Trim bias 240 does not introduce circuitry in the critical path of connection 232. Thus, trim bias 240 does not introduce nonlinearity, delay, noise, or frequency limitation issues as would be common with inline trim 220. In one example, system 200 provides regular or scheduled updates to trim bias 240. In one example, system 200 provides periodic updates to trim bias 240 based on measurements or feedback circuitry. In one example, system 200 provides continuous updates to trim bias 240 based on a feedforward or feedback loop.

Figure 3A:
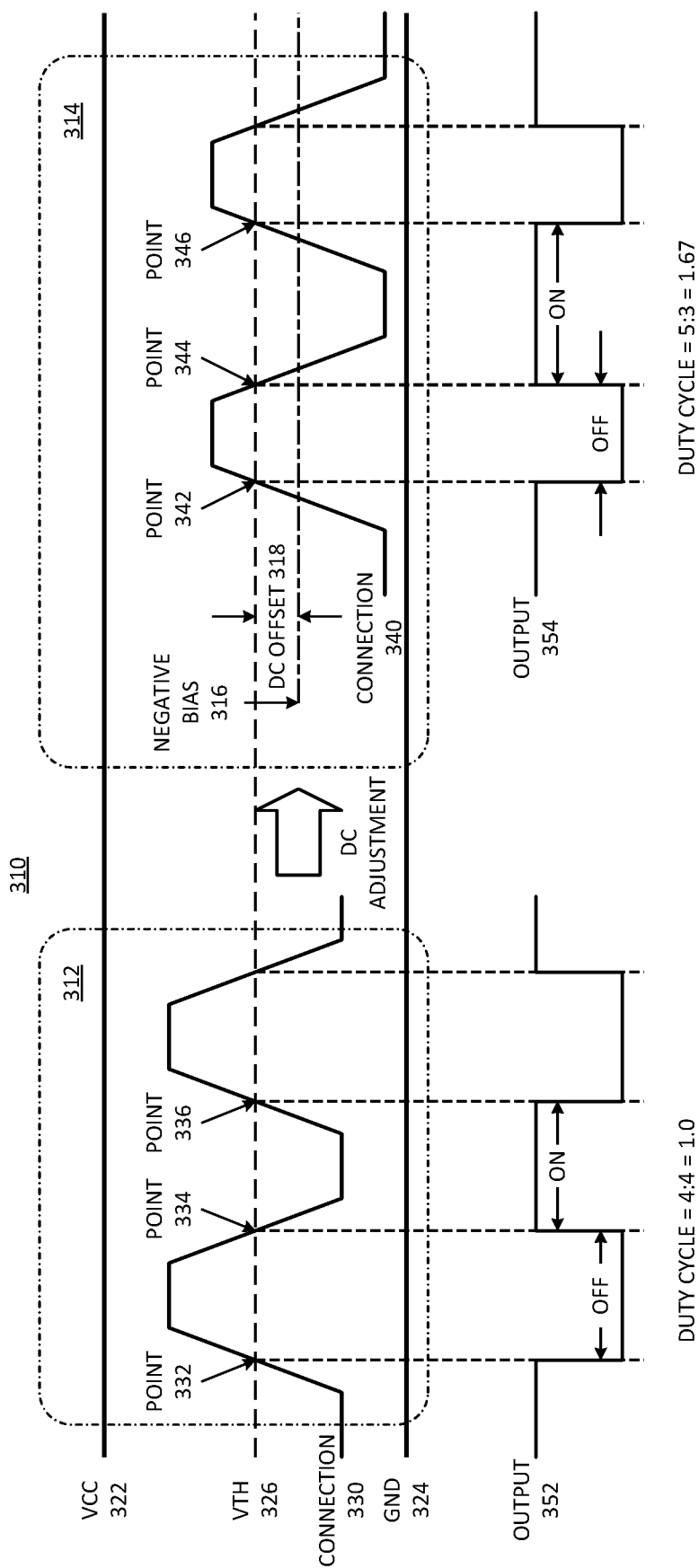
FIG. 3A is a diagrammatic representation of an example of duty cycle control from a negative voltage bias.

FIG. 3A is a diagrammatic representation of an example of duty cycle control from a negative voltage bias. Diagram 310 provides an output representation for a circuit such as circuit 200 with trim bias circuitry that adjusts a DC bias. Diagram 310 represents VCC 322, which is a high voltage threshold for signaling, and is in reference to GND (ground) 324, which represents a ground or low voltage reference for the signaling. Signals transmitted over communication lines will vary in amplitude between VCC 322 and GND 324. VTH 326 represents a threshold voltage. More particularly, VTH 326 represents a transition voltage threshold or a voltage level at which a digital output signal transitions from one logic value to another. In one example, a rising edge through VTH 326 transitions the signal from a logic '0' to a logic '1'. In the same example, a falling edge through VTH 326 would transition the signal from logic '1' to logic '0'. It will be understood that the logic output can be inverted, resulting in the opposite logical output: i.e., a rising edge transition could cause a one to zero transition and a falling edge transition could trigger a zero to one transition. The inverted logic example is illustrated in diagram 310 with respect to output 352 and output 354.

It will be understood, as illustrated in diagram 310, that the signal has an associated slew rate or signal slope corresponding to how long it takes for the signal to transition from a low voltage to a high voltage, or from a high voltage to a low voltage. It will be understood that the rising slope and the falling slope are not necessarily equal, even if they appear to be equal in the diagram. It will be understood based on diagram 310 that the longer the ramp up time or the flatter slope will provide greater duty cycle changes per bias offset. A steeper slope will result in less duty cycle change per change in bias. In one example, the system can be configured with slew rate control and bias control to create desired duty cycle changes.

Diagram 310 is illustrated as having two diagram portions, portion 312 and portion 314. Portion 312 illustrates the original signal, prior to applying a bias offset, to illustrate a comparison with portion 314 that illustrates the DC bias offset. Portion 312 illustrates signal 330, which represents the signal on the connection node between the pre-stage and the output stage for the system to which diagram 310 applies. Because it represents the signal on the connection node, signal 330 is labeled as "connection 330" in portion 312, but is described below as "signal 330". Signal 330 has three points where it crosses VTH 326, point 332 on a first rising edge, point 334 on a first falling edge, and point 336 on the second rising edge. Output 352 represents an output of the signal through the output stage. As illustrated, output 352 transitions from a high logic level to a low logic level in response to points 332 and 336, and transitions from a low logic level to a high logic level in response to point 334. As illustrated, output 352 has equal Off and On time with a ratio of 4 units to 4 units (4:4=1.0). Thus the duty cycle has a 1.0 ratio for output 352.

Portion 314 illustrates signal 340, which represents the signal on the connection node between the pre-stage and the output stage for the system to which diagram 310 applies. Like signal 330, signal 340 is labeled "connection 340" in diagram 310 and referred to in the descriptions as signal 340. Signal 340 has three points where it crosses VTH 326, point 342 on a first rising edge, point 344 on a first falling edge, and point 346 on the second rising edge. Signal 340 is the same as signal 330, but has DC offset 318 due to negative bias 316. Negative bias 316 causes every point of signal 340 to have a lower amplitude as compared to similar points on signal 330. For example, the labeled points, point 342, point 344, and point 346, occur closer to the highest amplitude of signal 340, relative to respective corresponding VTH-cross points 332, 334, and 336. The highest amplitude of signal 340 is lower than the highest amplitude of signal 330 by DC offset 318. Negative bias 316 can be provided by any mechanism to cause a negative DC offset. In one example, the system includes a current source to drive current into the electrical node of the connection of the pre-stage to the output stage, which drives the voltage lower.

Output 354 represents an output of the signal through the output stage in diagram portion 314. As illustrated, output 354 transitions from a high logic level to a low logic level in response to points 342 and 346, and transitions from a low logic level to a high logic level in response to point 344. As illustrated, output 354 has Off and On times that are not equal. Thus, DC offset 318 can be seen to adjust the duty cycle of the output signal. As illustrated, output 354 has a duty cycle with an On to Off ratio of 5:3 or 1.67. It will be understood that the change in duty cycle is merely one simple example, and the duty cycle change will depend on the headroom the signal has to the rails or the amount of voltage there is between the extremes of the signal and the high and low voltage references, as well as the slope or slew rate of the signal transitions. One of skill in the art will understand that control over these factors can provide careful control over the duty cycle.

Consider that DC offset 318 is provided by a bias current referred to as Ibias driven into the node of the connection between the early stages and the output stage of the I/O pathway. In such an example in accordance with diagram 310 where inverting logic is used, a larger Ibias will cause a negative bias offset. Thus, larger Ibias will make the duty cycle of the output (e.g., Out_n) larger.

Figure 3B:
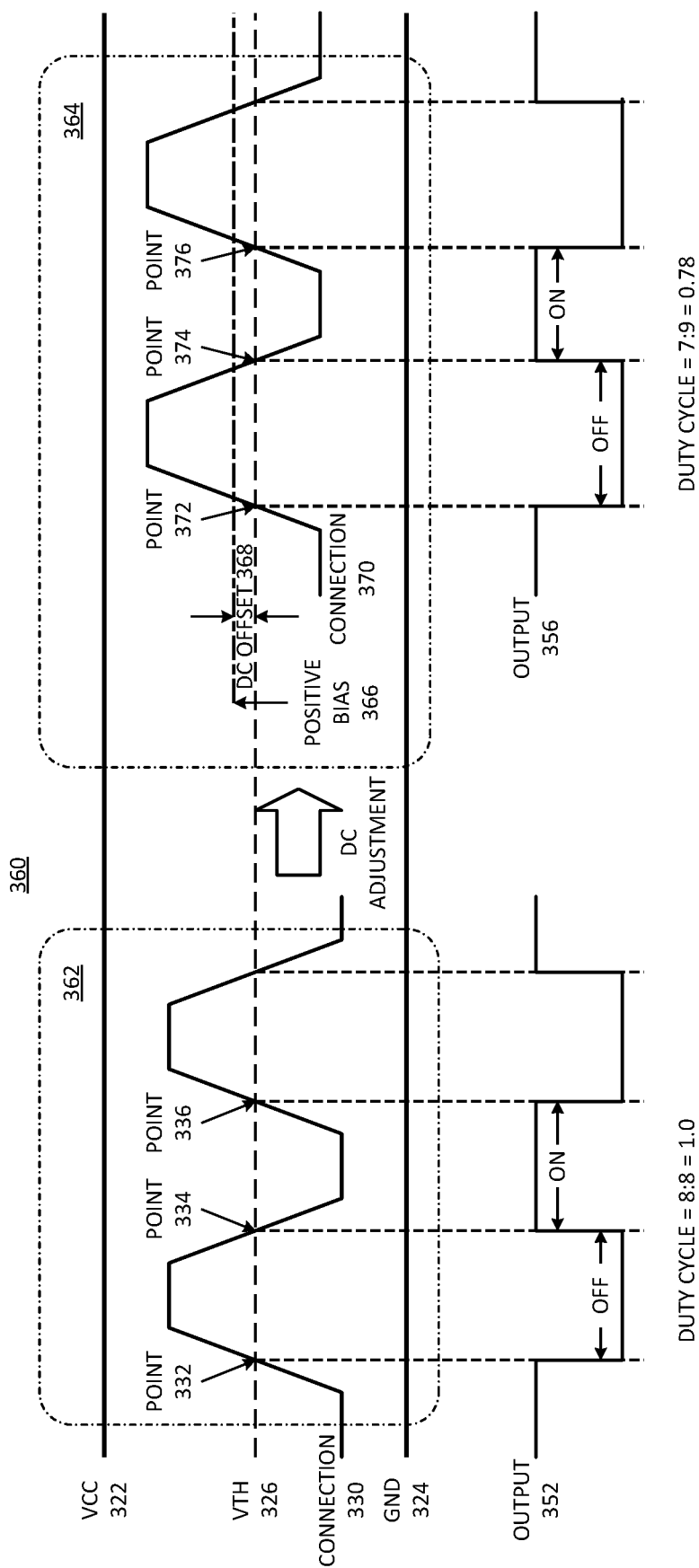
FIG. 3B is a diagrammatic representation of an example of duty cycle control from a positive voltage bias.

FIG. 3B is a diagrammatic representation of an example of duty cycle control from a positive voltage bias. Diagram 360 provides an output representation for a circuit such as circuit 200 with trim bias circuitry that adjusts a DC bias. Diagram 360 provides an alternative to diagram 310, which depicts a negative DC offset. Diagram 360 illustrates a positive DC offset. Diagram 360 represents VCC 322, GND 324, and VTH 326, which are described above. The descriptions above can apply to diagram 360 for like-numbered items and for general descriptions of slew rate and DC bias offset.

Diagram 360 is illustrated as having two diagram portions, portion 362 and portion 364. Portion 362 is like portion 312 of diagram 310. For purposes of diagram 360, the duty cycle ratio is made in reference to a comparison of signal Off and On time with a ratio of 8 units to 8 units (8:8=1.0). Thus the duty cycle has a 1.0 ratio for output 352.

Portion 364 illustrates signal 370, which represents the signal on the connection node between the pre-stage and the output stage for the system to which diagram 360 applies. Like signal 330, signal 370 is labeled "connection 370" in diagram 360 and referred to in the descriptions as signal 370. Signal 370 has three points where it crosses VTH 326, point 372 on a first rising edge, point 374 on a first falling edge, and point 376 on the second rising edge. Signal 370 is the same as signal 330, but has DC offset 368 due to positive bias 366. Positive bias 366 causes every point of signal 370 to have a higher amplitude as compared to similar points on signal 330. For example, the labeled points, point 372, point 374, and point 376, occur closer to the lowest amplitude of signal 370, relative to respective corresponding VTH-cross points 332, 334, and 336. The lowest amplitude of signal 370 is higher than the lowest amplitude of signal 330 by DC offset 368. Positive bias 366 can be provided by any mechanism to cause a positive DC offset. In one example, the system includes a current source to shunt current away from the electrical node of the connection of the pre-stage to the output stage, which drives the voltage higher.

Output 356 represents an output of the signal through the output stage in diagram portion 364. As illustrated, output 356 transitions from a high logic level to a low logic level in response to points 372 and 376, and transitions from a low logic level to a high logic level in response to point 374. As illustrated, output 356 has Off and On times that are not equal. Thus, DC offset 368 can be seen to adjust the duty cycle of the output signal. As illustrated, output 356 has a duty cycle with an On to Off ratio of 7:9 or 0.78. It will be understood that the change in duty cycle is merely one simple example, and the duty cycle change will depend on the headroom the signal has to the rails or the amount of voltage there is between the extremes of the signal and the high and low voltage references, as well as the slope or slew rate of the signal transitions. One of skill in the art will understand that control over these factors can provide careful control over the duty cycle.

Consider that DC offset 368 is provided by a bias current referred to as Ibias driven to cause the voltage of the connection node higher. In such an example in accordance with diagram 360 where inverting logic is used, a negative Ibias will cause a positive bias offset. Thus, reducing Ibias will make the duty cycle of the output (e.g., Out_n) smaller. The duty cycle adjustment of diagram 360 is thus the opposite as what is illustrated in diagram 310.

FIG. 4 is a block diagram of an example of a circuit to provide I/O (input/output) trim with a bias current. System 400 provides one example of either driver I/O circuitry in accordance with driver circuitry 122 of system 100, or buffer I/O circuitry in accordance with buffer circuitry 142 of system 100. System 400 provides an example of a system in accordance with system 200 of FIG. 2. System 400 receives signal 402 and generates output 424. In one example, signal 402 represents a data signal. In one example, signal 402 represents a clock signal. In one example, switch 430 can be understood as an implementation of trim bias 240 of system 200, or an extension of system 200.

System 400 illustrates one or more first stages 410, which will be referred to as first stage 410 in the following descriptions. First stage 410 represents one or more stages prior to the stage that generates the output. Last stage 420 represents one or more stages that generate output 424. System 400 includes connection 422 connecting first stage 410 to last stage 420. Connection 422 represents one or more signal lines, and can include circuit elements that transfer a version of signal 402 that is filtered, amplified, or otherwise manipulated from its input state.

System 400 includes switch 430 to control a bias applied to connection 422. Switch 430 can be considered to provide a trim bias to connection 422 or the node of the connection between first stage 410 and last stage 420. In one example, switch 430 is controlled by signal Vbias. In one example, Vbias is a voltage applied by a static probe. In one example, Vbias is a voltage applied by a static calibration trim, such as a fused signal value (e.g., converted through a digital to analog circuit). In one example, a controller or control logic (not explicitly shown) generates Vbias either directly as a voltage, or indirectly by generating a code that is converted to drive switch 430. Thus, in one example, Vbias is a variable bias voltage that can dynamically adjust the bias applied to connection 422. In one example, a static trim is applied to connection 422 to adjust for a known or relatively fixed nonlinearity in first stage 410.

Vbias can be selectively applied to switch 430. Thus, switch 430 is not necessarily always one. In one example, system 400 applies Vbias to switch 430, which induces current Ibias to flow through switch 430. Ibias adjusts the duty cycle of output 424. Consider an example where Vbias is a fixed value. For certain applications system 400 generates output 424 with a duty cycle resulting from the processing of first stage 410 and last stage 420. In other applications system 400 applies Vbias to a fixed value, inducing Ibias to adjust the DC offset of connection 422, to change the duty cycle of output 424. Ibias can be configured to extend or shorten the DC bias of how first stage 410 drives last stage 420 through connection 422. Adjustment to how first stage 410 drives last stage 420 can adjust the duty cycle of the final stage output 424. In an example where Vbias is variable, system 400 can drive the DC offset of connection 422 with more offset or less offset.

Control over the offset provides control over the duty cycle of output 424. The control over the offset can refer to binary-type control, such as providing an offset or not providing an offset. The control over the offset can refer to selectable control, such as providing one of a selected number of offsets (e.g., 4, 8, 16, 100, or some other number of offsets). The control over the offset can refer to analog control a high number of selectable outputs, to provide an offset value with fine grain control. Thus, system 400 can be designed to provide variations in range and variations in resolution, or variations in both range and resolution.

In general, system 400 provides bias control that can be very simple for basic function, or with any level of complexity to provide specific control over performance. With control over the output duty cycle, system 400 can provide good trim linearity. One example of system 400 can guarantee monotonic function of duty cycle trim control. System 400 can control Vbias to drive Ibias to control the duty cycle of the output by biasing connection 422. The adjustment to the duty cycle can operate in accordance with any description herein.

Figure 5:
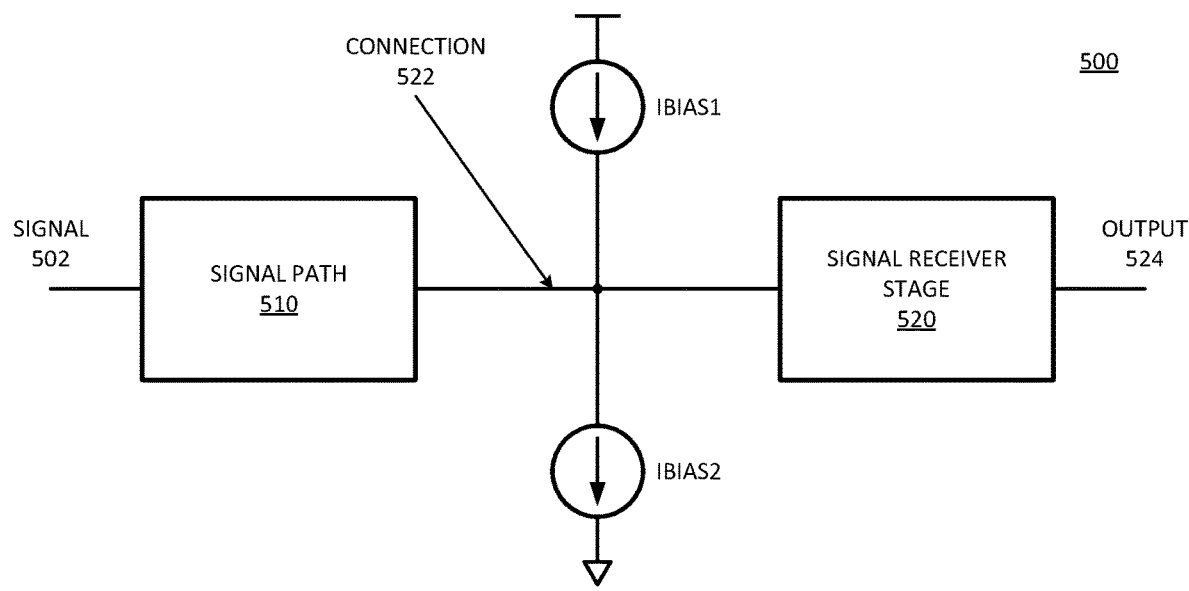
FIG. 5 is a block diagram of an example of a circuit to provide I/O (input/output) trim with negative and positive bias current sources.

FIG. 5 is a block diagram of an example of a circuit to provide I/O (input/output) trim with negative and positive bias current sources. System 500 provides one example of either driver I/O circuitry in accordance with driver circuitry 122 of system 100, or buffer I/O circuitry in accordance with buffer circuitry 142 of system 100. System 500 provides an example of a system in accordance with system 200 of FIG. 2. System 500 receives signal 502 and generates output 524. In one example, signal 502 represents a data signal. In one example, signal 502 represents a clock signal. In one example, the bias current sources in system 500 can be understood as an implementation of trim bias 240 of system 200, or an extension of system 200.

System 500 includes signal path 510 and amplifier/comparator 520. Signal path 510 can be or include one or more stages of circuitry to process signal 502 in preparation for operation by amplifier/comparator 520. Amplifier/comparator 520 represents a final stage of processing of signal 502 to produce output 524. Signal path 510 can include one or more stages of circuitry to perform buffering, amplification, processing, or some other operation, or a combination of these with respect to signal 502. Signal receiver stage 520 generates the desired output signal, output 524. For example, signal receiver stage 520 can be an amplifier or a comparator.

Connection 522 represents one or more signal lines, and can include circuit elements that transfer a version of signal 502 that is from signal path 510 to amplifier/comparator 520. In one example, system 500 includes two current sources, Ibias1 and Ibias2. In one example, Ibias2 represents a switch element such as switch 430 of system 400. Ibias1 can be similar. In one example, Ibias1 is implemented with PMOS (p-channel metal oxide semiconductor) circuitry. P-channel refers to an active semiconductor circuit element that creates a conductive channel when a gate is biased with a voltage, where the conductors are holes. N-channel refers to an active semiconductor circuit element that creates a conductive channel when a gate is biased with a voltage, where the conductors are electrons. In one example, Ibias2 is implemented with NMOS (n-channel metal oxide semiconductor) circuitry. The complementary MOS circuitry (CMOS) can provide a pull-up and pull-down effect to connection 522.

Ibias1 operates as a pull up device. Ibias2 operates as a pull down device. Ibias1 flowing into connection 522 will tend to provide a positive bias to connection 522, which Ibias2 flowing out of connection 522 will tend to provide a negative bias to connection 522. In one example, system 500 applies control to Ibias1 and Ibias2 to adjust the duty cycle of signal receiver stage 520 by biasing connection 522. Ibias1+Ibias2 represents a control of the trim of connection 522. Controlling Ibias1 and Ibias2 can manipulate pull up and pull down delay skew on connection 522. In one example, multiple stages can be controlled along the signal path, and not only the final connection between the pre-stages and the last stage. Control of the pull up and pull down delay skew for selected stages enables control over the output duty cycle adjustment. The control of Ibias1 and Ibias2 can operate like traditional trim control in that application of a trim signal adjusts at least one output signal timing parameter. Duty cycle is a result of adjusting the timing parameters, such as skew or signal bias.

An implementation of system 500 in silicon with one or more current mirrors for Ibias1 or Ibias2, or for both, demonstrates that the design provides Iout=Iref*trim_factor. The Iout represents the final current provided on connection 522. Iref refers to the current on connection 522 based on signal 502 through signal path 510. trim_factor represents trim control to calibrate the output. Such an implementation has shown that trim control with bias control over connection 522 can achieve a very good trim linearity where there is sufficient calibration range to provide the control. It will be understood that Iref and trim_factor can be controlled with control signal to achieve a desired trim range and resolution.

It will be understood that system 500 can support any combination of control over Ibias1 and Ibias2. For example, with simple on/off control over Ibias1 and Ibias2, there can be at least 4 different levels of bias control over connection 522. With increased complexity to increase the number of levels of possible current output, the controllability of connection 522 can be increased significantly, to allow any level of control over the bias of connection 522.

Figure 6A:
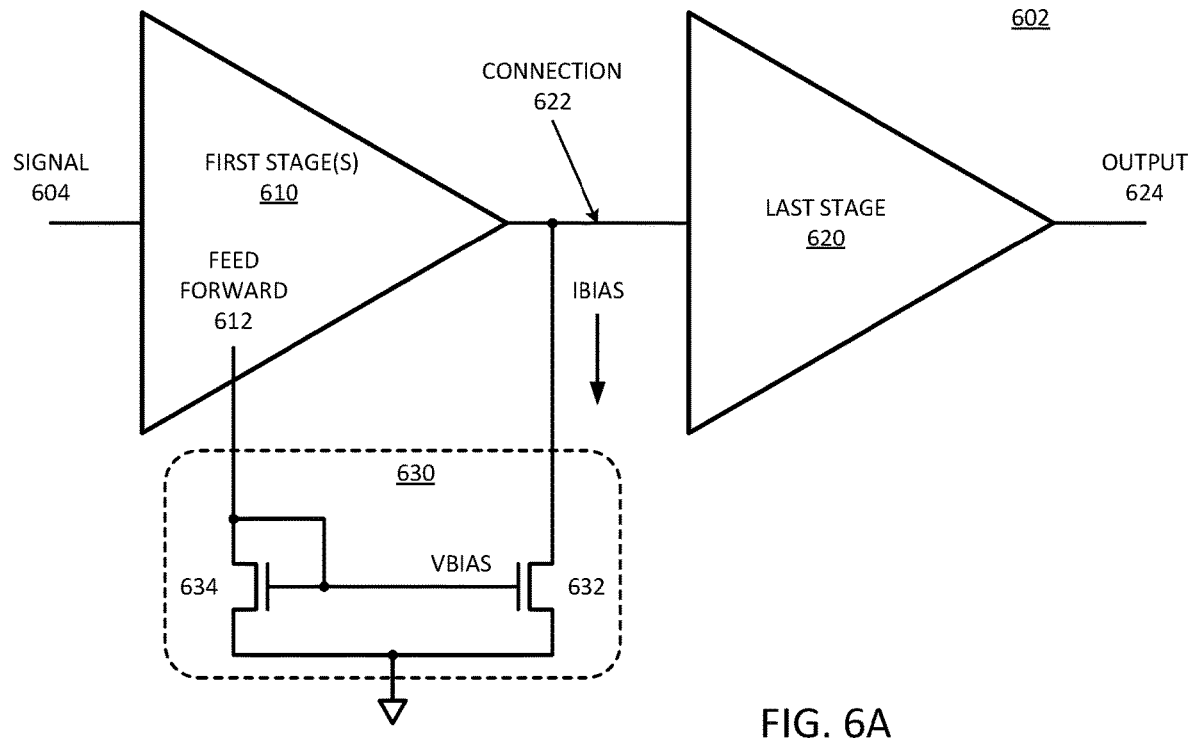
FIG. 6A is a block diagram of an example of a circuit to provide I/O (input/output) trim with a bias current from a current mirror with a feed forward path.

FIG. 6A is a block diagram of an example of a circuit to provide I/O (input/output) trim with a bias current from a current mirror with a feed forward path. System 602 provides one example of either driver I/O circuitry in accordance with driver circuitry 122 of system 100, or buffer I/O circuitry in accordance with buffer circuitry 142 of system 100. System 602 provides an example of a system in accordance with system 200 of FIG. 2. System 602 receives signal 604 and generates output 624. In one example, signal 604 represents a data signal. In one example, signal 604 represents a clock signal. In one example, circuitry 630 can be understood as an implementation of trim bias 240 of system 200, or an extension of system 200, or an implementation of a current source bias circuit in accordance with Ibias2 of system 500. It will be understood that a similar circuit could be used as in conjunction with Ibias1 of system 500, or as an implementation of Ibias1 of system 500.

System 602 illustrates one or more first stages 610, which will be referred to as first stage 610 in the following descriptions. First stage 610 represents one or more stages prior to the stage that generates the output. Last stage 620 represents one or more stages that generate output 624. System 602 includes connection 622 connecting first stage 610 to last stage 620. Connection 622 represents one or more signal lines, and can include circuit elements that transfer a version of signal 602 that is filtered, amplified, or otherwise manipulated from its input state.

System 602 includes circuitry 630 to control a bias applied to connection 622. Circuitry 630 can be considered to provide a trim bias to connection 622 or the node of the connection between first stage 610 and last stage 620. In one example, circuitry 630 represents a current mirror to provide feed forward control of Vbias. Such control of Vbias provides a continuous or nearly continuous control over Vbias to adjust for one or more conditions of first stage 610. Circuitry 630 provides a current mirror with transistor 632 coupled in a current mirror configuration with transistor 634. Transistor 634 has a drain coupled to feed forward signal 612, and the drain is coupled to the gate. The gates of transistors 634 and 632 are connected. The sources of the transistors are coupled to a ground reference. In the current mirror configuration, a current of interest in first stage 610 can be fed forward to cause Ibias to match the current to apply bias compensation to connection 622. The charging and discharging of a current in first stage 610 can dynamically cause a bias offset on connection 622, which in turn changes the duty cycle of output 624 to offset the current in first stage 610.

Figure 6B:
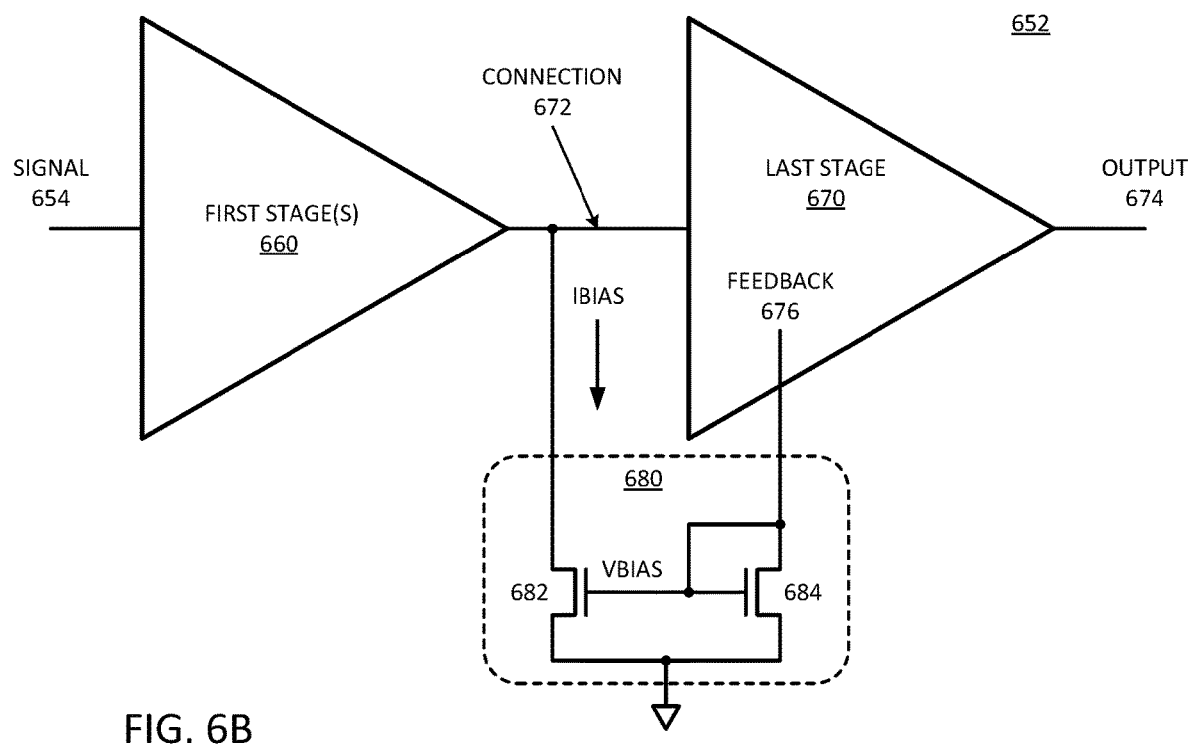
FIG. 6B is a block diagram of an example of a circuit to provide I/O (input/output) trim with a bias current from a current mirror with feedback.

FIG. 6B is a block diagram of an example of a circuit to provide I/O (input/output) trim with a bias current from a current mirror with feedback. System 652 provides one example of either driver I/O circuitry in accordance with driver circuitry 122 of system 100, or buffer I/O circuitry in accordance with buffer circuitry 142 of system 100. System 652 provides an example of a system in accordance with system 200 of FIG. 2. System 652 receives signal 654 and generates output 674. In one example, signal 654 represents a data signal. In one example, signal 654 represents a clock signal. In one example, circuitry 680 can be understood as an implementation of trim bias 240 of system 200, or an extension of system 200, or an implementation of a current source bias circuit in accordance with Ibias2 of system 500. It will be understood that a similar circuit could be used as in conjunction with Ibias1 of system 500, or as an implementation of Ibias1 of system 500.

System 652 illustrates one or more first stages 660, which will be referred to as first stage 660 in the following descriptions. First stage 660 represents one or more stages prior to the stage that generates the output. Last stage 670 represents one or more stages that generate output 624. System 652 includes connection 672 connecting first stage 660 to last stage 670. Connection 672 represents one or more signal lines, and can include circuit elements that transfer a version of signal 652 that is filtered, amplified, or otherwise manipulated from its input state.

System 652 includes circuitry 680 to control a bias applied to connection 672. Circuitry 680 can be considered to provide a trim bias to connection 672 or the node of the connection between first stage 660 and last stage 670. In one example, circuitry 680 represents a current mirror to provide feedback control of Vbias. Such control of Vbias provides a continuous or nearly continuous control over Vbias to adjust for one or more conditions of last stage 670. Circuitry 680 provides a current mirror with transistor 682 coupled in a current mirror configuration with transistor 684. Transistor 684 has a drain coupled to feedback signal 676, and the drain is coupled to the gate. The gates of transistors 684 and 682 are connected. The sources of the transistors are coupled to a ground reference. In the current mirror configuration, a current of interest in last stage 670 can be feedback to cause Ibias to match the current to apply bias compensation to connection 672. The current of feedback signal 676 in last stage 670 can dynamically cause a bias offset on connection 672, which in turn changes the duty cycle of output 674 to compensate.

Figure 7:
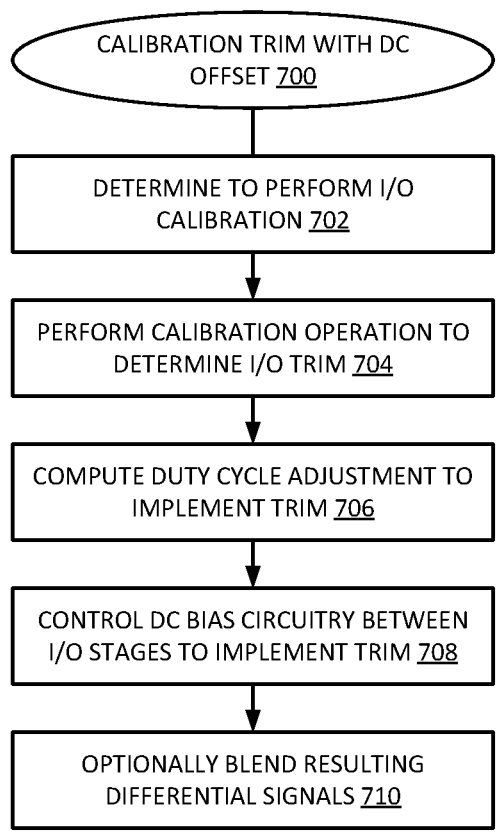
FIG. 7 is a flow diagram of an example of a process for providing duty cycle adjustment with a DC (direct current) offset.

FIG. 7 is a flow diagram of an example of a process for providing duty cycle adjustment with a DC (direct current) offset. Process 700 represents a process flow to calibration trim with a DC offset.

In one example, the system determines to perform I/O calibration, block 702. The I/O calibration can be for transmit or receive in accordance with what is described herein. The I/O calibration can adjust the I/O phase of the signal through multiple stages of input for a receiver or multiple stages of output for a transmitter. In one example, the system performs calibration operations to determine what the I/O trim should be to aligned signaling edges, block 704.

The result of the calibration operation can determine an adjustment needed for better signal integrity. In one example, the system computes a duty cycle adjustment to implement the determined trim for the I/O signaling, block 706. In one example, the system controls DC bias circuitry between I/O stages to implement the trim, block 708. The DC bias control can be in accordance with any example provided herein. The system can optionally blend the phases of resulting differential signals, 710. The blending can align the complementary edges of the differential halves of the signal.

Figure 8:
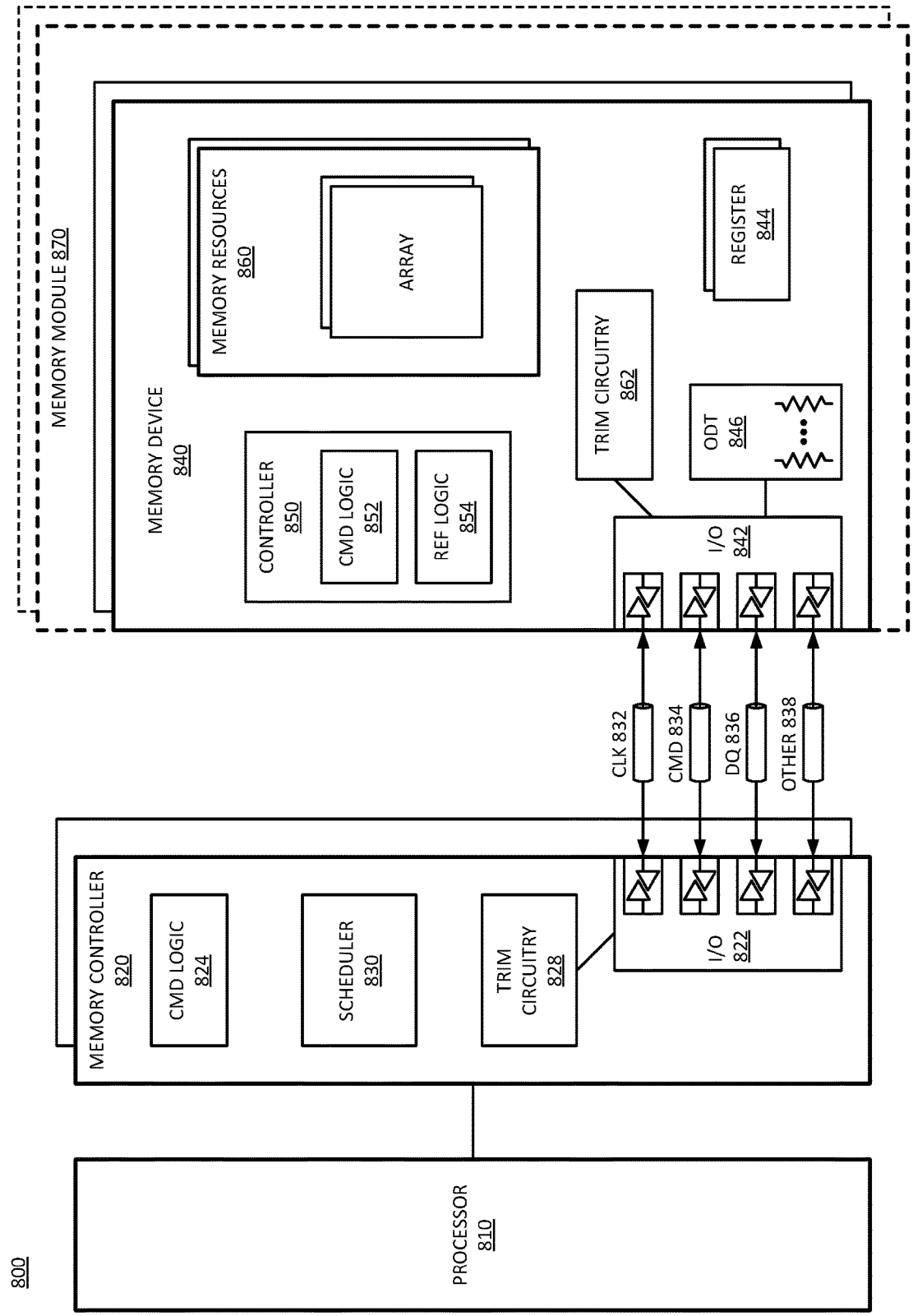
FIG. 8 is a block diagram of an example of a memory subsystem in which duty cycle control by DC offset can be implemented.

FIG. 8 is a block diagram of an example of a memory subsystem in which duty cycle control by DC offset can be implemented. System 800 includes a processor and elements of a memory subsystem in a computing device.

In one example, system 800 includes trim circuitry 828 in memory controller 820. Trim circuitry 828 can represent adaptive control to adjust the duty cycle of an I/O signal of I/O 822 based on bias control in accordance with any example herein. In one example, system 800 includes trim circuitry 862 in memory device 840. Trim circuitry 862 can represent adaptive control to adjust the duty cycle of an I/O signal of I/O 842 based on bias control in accordance with any example herein. In one example, the trim is specifically applied by an input buffer of memory controller 820 on a signal received from memory device 840.

Processor 810 represents a processing unit of a computing platform that may execute an operating system (OS) and applications, which can collectively be referred to as the host or the user of the memory. The OS and applications execute operations that result in memory accesses. Processor 810 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 800 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 820 represents one or more memory controller circuits or devices for system 800. Memory controller 820 represents control logic that generates memory access commands in response to the execution of operations by processor 810. Memory controller 820 accesses one or more memory devices 840. Memory devices 840 can be DRAM devices in accordance with any referred to above. In one example, memory devices 840 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 820 manages a separate memory channel, although system 800 can be configured to have multiple channels managed by a single controller, or to have multiple controllers on a single channel. In one example, memory controller 820 is part of host processor 810, such as logic implemented on the same die or implemented in the same package space as the processor.

Memory controller 820 includes I/O interface logic 822 to couple to a memory bus, such as a memory channel as referred to above. I/O interface logic 822 (as well as I/O interface logic 842 of memory device 840) can include pins, pads, connectors, signal lines, traces, or wires, or other hardware to connect the devices, or a combination of these. I/O interface logic 822 can include a hardware interface. As illustrated, I/O interface logic 822 includes at least drivers/transceivers for signal lines. Commonly, wires within an integrated circuit interface couple with a pad, pin, or connector to interface signal lines or traces or other wires between devices. I/O interface logic 822 can include drivers, receivers, transceivers, or termination, or other circuitry or combinations of circuitry to exchange signals on the signal lines between the devices. The exchange of signals includes at least one of transmit or receive. While shown as coupling I/O 822 from memory controller 820 to I/O 842 of memory device 840, it will be understood that in an implementation of system 800 where groups of memory devices 840 are accessed in parallel, multiple memory devices can include I/O interfaces to the same interface of memory controller 820. In an implementation of system 800 including one or more memory modules 870, I/O 842 can include interface hardware of the memory module in addition to interface hardware on the memory device itself. Other memory controllers 820 will include separate interfaces to other memory devices 840.

The bus between memory controller 820 and memory devices 840 can be implemented as multiple signal lines coupling memory controller 820 to memory devices 840. The bus may typically include at least clock (CLK) 832, command/address (CMD) 834, and write data (DQ) and read data (DQ) 836, and zero or more other signal lines 838. In one example, a bus or connection between memory controller 820 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 800 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 820 and memory devices 840. An example of a serial bus technology is 8B10B encoding and transmission of high-speed data with embedded clock over a single differential pair of signals in each direction. In one example, CMD 834 represents signal lines shared in parallel with multiple memory devices. In one example, multiple memory devices share encoding command signal lines of CMD 834, and each has a separate chip select (CS_n) signal line to select individual memory devices.

It will be understood that in the example of system 800, the bus between memory controller 820 and memory devices 840 includes a subsidiary command bus CMD 834 and a subsidiary bus to carry the write and read data, DQ 836. In one example, the data bus can include bidirectional lines for read data and for write/command data. In another example, the subsidiary bus DQ 836 can include unidirectional write signal lines for write and data from the host to memory, and can include unidirectional lines for read data from the memory to the host. In accordance with the chosen memory technology and system design, other signals 838 may accompany a bus or sub bus, such as strobe lines DQS. Based on design of system 800, or implementation if a design supports multiple implementations, the data bus can have more or less bandwidth per memory device 840. For example, the data bus can support memory devices that have either a x32 interface, a x16 interface, a x8 interface, or other interface. The convention "xW," where W is an integer that refers to an interface size or width of the interface of memory device 840, which represents a number of signal lines to exchange data with memory controller 820. The interface size of the memory devices is a controlling factor on how many memory devices can be used concurrently per channel in system 800 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 840 and memory controller 820 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 840 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 840 represent memory resources for system 800. In one example, each memory device 840 is a separate memory die. In one example, each memory device 840 can interface with multiple (e.g., 2) channels per device or die. Each memory device 840 includes I/O interface logic 842, which has a bandwidth determined by the implementation of the device (e.g., x16 or x8 or some other interface bandwidth). I/O interface logic 842 enables the memory devices to interface with memory controller 820. I/O interface logic 842 can include a hardware interface, and can be in accordance with I/O 822 of memory controller, but at the memory device end. In one example, multiple memory devices 840 are connected in parallel to the same command and data buses. In another example, multiple memory devices 840 are connected in parallel to the same command bus, and are connected to different data buses. For example, system 800 can be configured with multiple memory devices 840 coupled in parallel, with each memory device responding to a command, and accessing memory resources 860 internal to each. For a Write operation, an individual memory device 840 can write a portion of the overall data word, and for a Read operation, an individual memory device 840 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one example, memory devices 840 are disposed directly on a motherboard or host system platform (e.g., a PCB (printed circuit board) on which processor 810 is disposed) of a computing device. In one example, memory devices 840 can be organized into memory modules 870. In one example, memory modules 870 represent dual inline memory modules (DIMMs). In one example, memory modules 870 represent other organization of multiple memory devices to share at least a portion of access or control circuitry, which can be a separate circuit, a separate device, or a separate board from the host system platform. Memory modules 870 can include multiple memory devices 840, and the memory modules can include support for multiple separate channels to the included memory devices disposed on them. In another example, memory devices 840 may be incorporated into the same package as memory controller 820, such as by techniques such as multi-chip-module (MCM), package-on-package, through-silicon via (TSV), or other techniques or combinations. Similarly, in one example, multiple memory devices 840 may be incorporated into memory modules 870, which themselves may be incorporated into the same package as memory controller 820. It will be appreciated that for these and other implementations, memory controller 820 may be part of host processor 810.

Memory devices 840 each include memory resources 860. Memory resources 860 represent individual arrays of memory locations or storage locations for data. Typically memory resources 860 are managed as rows of data, accessed via wordline (rows) and bitline (individual bits within a row) control. Memory resources 860 can be organized as separate channels, ranks, and banks of memory. Channels may refer to independent control paths to storage locations within memory devices 840. Ranks may refer to common locations across multiple memory devices (e.g., same row addresses within different devices). Banks may refer to arrays of memory locations within a memory device 840. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 840 include one or more registers 844. Register 844 represents one or more storage devices or storage locations that provide configuration or settings for the operation of the memory device. In one example, register 844 can provide a storage location for memory device 840 to store data for access by memory controller 820 as part of a control or management operation. In one example, register 844 includes one or more Mode Registers. In one example, register 844 includes one or more multipurpose registers. The configuration of locations within register 844 can configure memory device 840 to operate in different "modes," where command information can trigger different operations within memory device 840 based on the mode. Additionally or in the alternative, different modes can also trigger different operation from address information or other signal lines depending on the mode. Settings of register 844 can indicate configuration for I/O settings (e.g., timing, termination or ODT (on-die termination) 846, driver configuration, or other I/O settings).

In one example, memory device 840 includes ODT 846 as part of the interface hardware associated with I/O 842. ODT 846 can be configured as mentioned above, and provide settings for impedance to be applied to the interface to specified signal lines. In one example, ODT 846 is applied to DQ signal lines. In one example, ODT 846 is applied to command signal lines. In one example, ODT 846 is applied to address signal lines. In one example, ODT 846 can be applied to any combination of the preceding. The ODT settings can be changed based on whether a memory device is a selected target of an access operation or a non-target device. ODT 846 settings can affect the timing and reflections of signaling on the terminated lines. Careful control over ODT 846 can enable higher-speed operation with improved matching of applied impedance and loading. ODT 846 can be applied to specific signal lines of I/O interface 842, 822, and is not necessarily applied to all signal lines.

Memory device 840 includes controller 850, which represents control logic within the memory device to control internal operations within the memory device. For example, controller 850 decodes commands sent by memory controller 820 and generates internal operations to execute or satisfy the commands. Controller 850 can be referred to as an internal controller, and is separate from memory controller 820 of the host. Controller 850 can determine what mode is selected based on register 844, and configure the internal execution of operations for access to memory resources 860 or other operations based on the selected mode. Controller 850 generates control signals to control the routing of bits within memory device 840 to provide a proper interface for the selected mode and direct a command to the proper memory locations or addresses. Controller 850 includes command logic 852, which can decode command encoding received on command and address signal lines. Thus, command logic 852 can be or include a command decoder. With command logic 852, memory device can identify commands and generate internal operations to execute requested commands.

Referring again to memory controller 820, memory controller 820 includes command (CMD) logic 824, which represents logic or circuitry to generate commands to send to memory devices 840. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 840, memory controller 820 can issue commands via I/O 822 to cause memory device 840 to execute the commands. In one example, controller 850 of memory device 840 receives and decodes command and address information received via I/O 842 from memory controller 820. Based on the received command and address information, controller 850 can control the timing of operations of the logic and circuitry within memory device 840 to execute the commands. Controller 850 is responsible for compliance with standards or specifications within memory device 840, such as timing and signaling requirements. Memory controller 820 can implement compliance with standards or specifications by access scheduling and control.

Memory controller 820 includes scheduler 830, which represents logic or circuitry to generate and order transactions to send to memory device 840. From one perspective, the primary function of memory controller 820 could be said to schedule memory access and other transactions to memory device 840. Such scheduling can include generating the transactions themselves to implement the requests for data by processor 810 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 820 typically includes logic such as scheduler 830 to allow selection and ordering of transactions to improve performance of system 800. Thus, memory controller 820 can select which of the outstanding transactions should be sent to memory device 840 in which order, which is typically achieved with logic much more complex that a simple first-in first-out algorithm. Memory controller 820 manages the transmission of the transactions to memory device 840, and manages the timing associated with the transaction. In one example, transactions have deterministic timing, which can be managed by memory controller 820 and used in determining how to schedule the transactions with scheduler 830.

In one example, memory controller 820 includes refresh (REF) logic 826. Refresh logic 826 can be used for memory resources that are volatile and need to be refreshed to retain a deterministic state. In one example, refresh logic 826 indicates a location for refresh, and a type of refresh to perform. Refresh logic 826 can trigger self-refresh within memory device 840, or execute external refreshes which can be referred to as auto refresh commands) by sending refresh commands, or a combination. In one example, system 800 supports all bank refreshes as well as per bank refreshes. All bank refreshes cause the refreshing of banks within all memory devices 840 coupled in parallel. Per bank refreshes cause the refreshing of a specified bank within a specified memory device 840. In one example, controller 850 within memory device 840 includes refresh logic 854 to apply refresh within memory device 840. In one example, refresh logic 854 generates internal operations to perform refresh in accordance with an external refresh received from memory controller 820. Refresh logic 854 can determine if a refresh is directed to memory device 840, and what memory resources 860 to refresh in response to the command.

Figure 9:
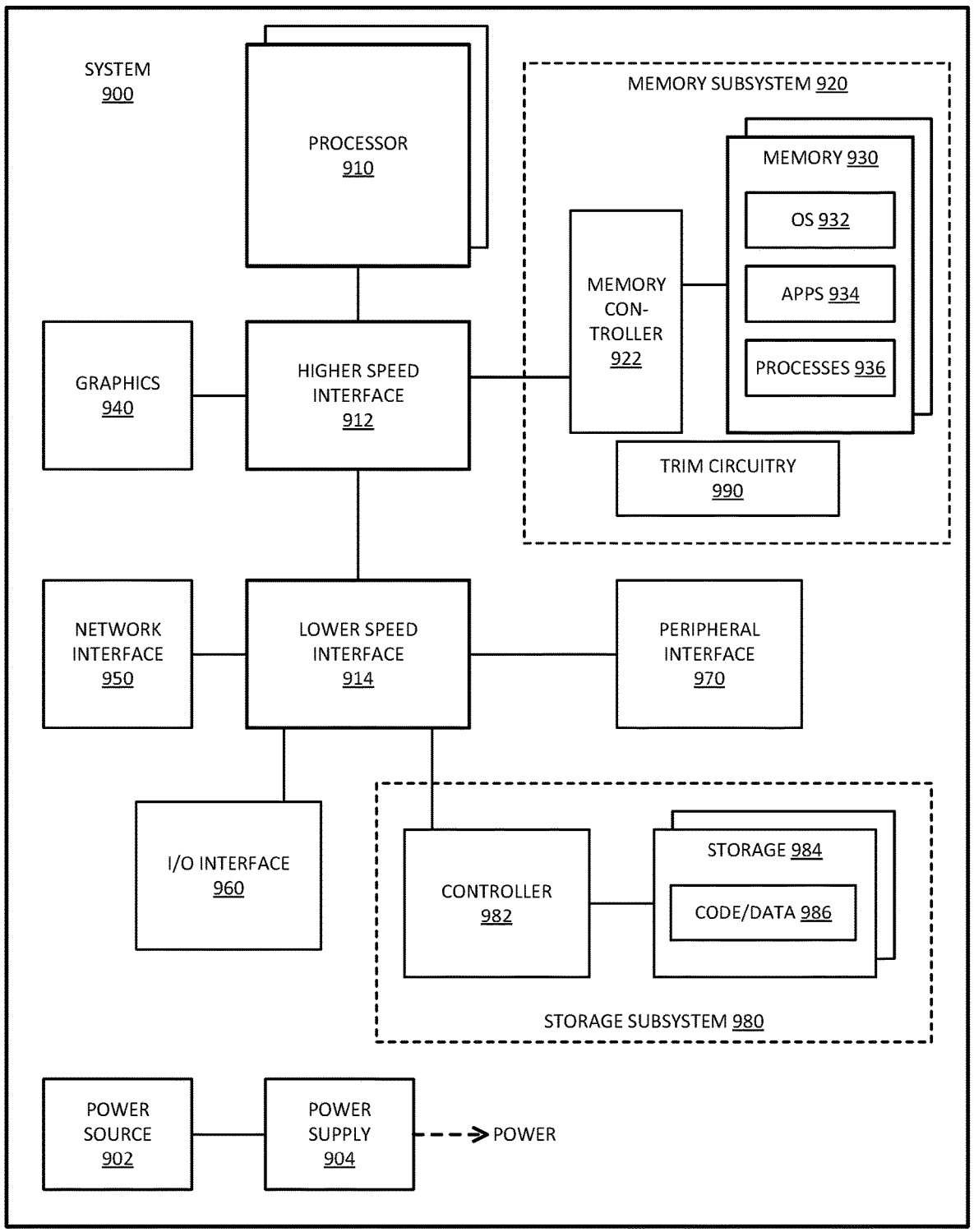
FIG. 9 is a block diagram of an example of a computing system in which duty cycle control by DC offset can be implemented.

FIG. 9 is a block diagram of an example of a computing system in which duty cycle control by DC offset can be implemented. System 900 represents a computing device in accordance with any example herein, and can be a laptop computer, a desktop computer, a tablet computer, a server, a gaming or entertainment control system, embedded computing device, or other electronic device.

In one example, system 900 includes trim circuitry 990 in memory subsystem 920. Trim circuitry 990 represents circuitry to adjust the duty cycle of an I/O signal between memory controller 922 and memory 930. Trim circuitry 990 adjusts the duty cycle of an I/O signal based on bias control in accordance with any example herein.

System 900 includes processor 910 can include any type of microprocessor, central processing unit (CPU), graphics processing unit (GPU), processing core, or other processing hardware, or a combination, to provide processing or execution of instructions for system 900. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 902 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
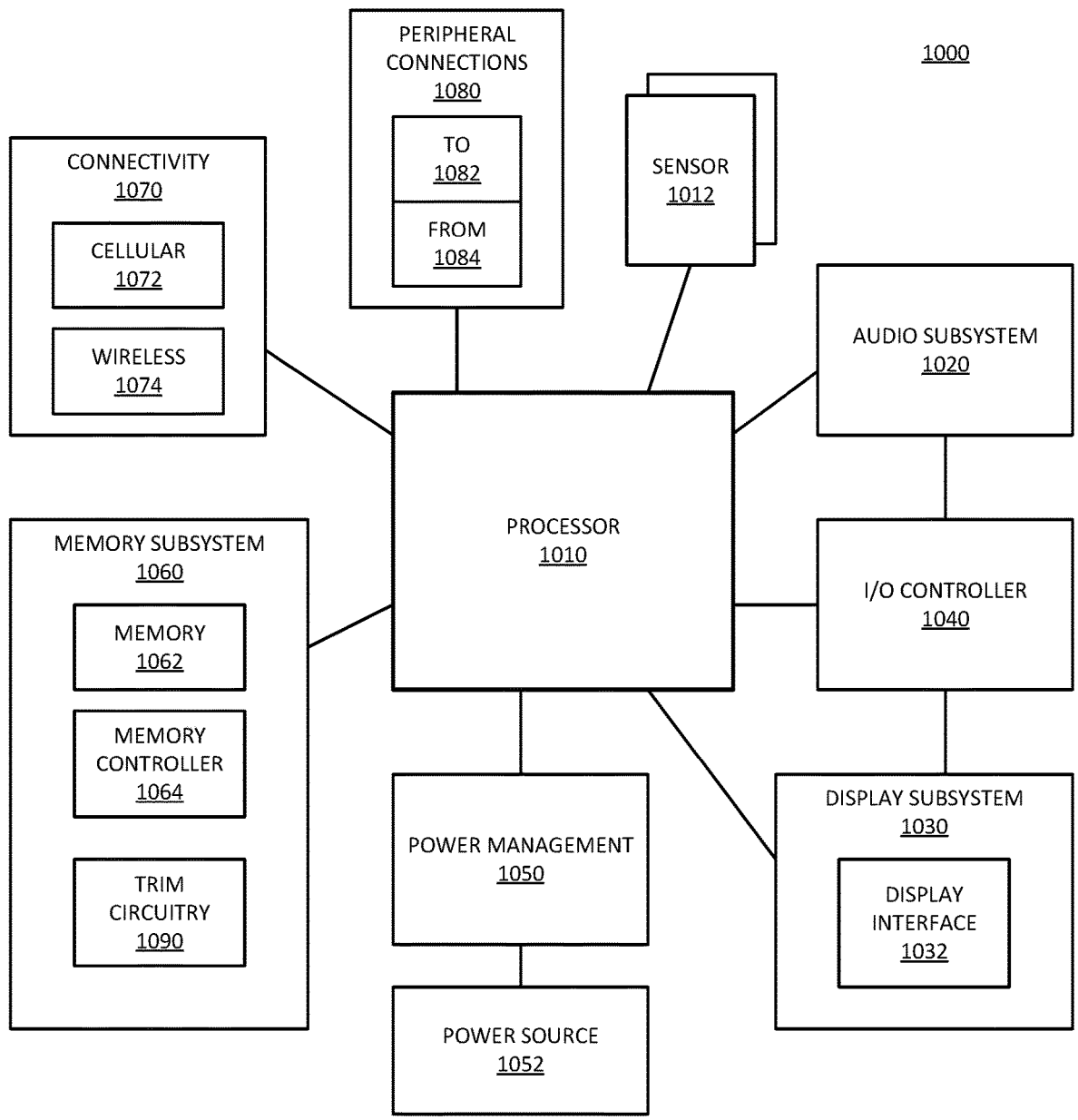
FIG. 10 is a block diagram of an example of a mobile device in which duty cycle control by DC offset can be implemented.

FIG. 10 is a block diagram of an example of a mobile device in which duty cycle control by DC offset can be implemented. Device 1000 represents a mobile computing device, such as a computing tablet, a mobile phone or smartphone, wearable computing device, or other mobile device, or an embedded computing device. It will be understood that certain of the components are shown generally, and not all components of such a device are shown in device 1000.

In one example, system 1000 includes trim circuitry 1090 in memory subsystem 1060. Trim circuitry 1090 represents circuitry to adjust the duty cycle of an I/O signal between memory controller 1064 and memory 1062. Trim circuitry 1090 adjusts the duty cycle of an I/O signal based on bias control in accordance with any example herein.

Device 1000 includes processor 1010, which performs the primary processing operations of device 1000. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting device 1000 to another device, or a combination. The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with system 1000. In one example, one or more sensors 1012 couples to processor 1010 via a frontend circuit integrated with processor 1010. In one example, one or more sensors 1012 couples to processor 1010 via another component of system 1000.

In one example, device 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1000, or connected to device 1000. In one example, a user interacts with device 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) or ultra-high definition (UHD) display that provides an output to a user. In one example, display subsystem includes or drives a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to device 1000 through which a user might interact with the system. For example, devices that can be attached to device 1000 might include microphone devices, speaker or stereo systems, video systems or other display device, keyboard or keypad devices, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of device 1000. Additionally, audio output can be provided instead of or in addition to display output. In another example, if display subsystem includes a touchscreen, the display device also acts as an input device, which can be at least partially managed by I/O controller 1040. There can also be additional buttons or switches on device 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in device 1000, or sensors 1012. The input can be part of direct user interaction, as well as providing environmental input to the system to influence its operations (such as filtering for noise, adjusting displays for brightness detection, applying a flash for a camera, or other features).

In one example, device 1000 includes power management 1050 that manages battery power usage, charging of the battery, and features related to power saving operation. Power management 1050 manages power from power source 1052, which provides power to the components of system 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in device 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable device 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that device 1000 could both be a peripheral device ("to" 1082) to other computing devices, as well as have peripheral devices ("from" 1084) connected to it. Device 1000 commonly has a "docking" connector to connect to other computing devices for purposes such as managing (e.g., downloading, uploading, changing, synchronizing) content on device 1000. Additionally, a docking connector can allow device 1000 to connect to certain peripherals that allow device 1000 to control content output, for example, to audiovisual or other systems.

In addition to a proprietary docking connector or other proprietary connection hardware, device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example an apparatus includes: an input/output (I/O) predriver stage; an I/O output stage coupled to the predriver stage through a connection between the predriver stage and the output stage, the output stage to be driven by the predriver stage; and a control circuit to control a direct current (DC) bias of the connection between the predriver stage and the output stage to provide trim adjustment of a duty cycle of an output of the output stage.

In one example, the I/O predriver stage comprises an input buffer predriver stage and wherein the I/O output stage comprises an input buffer output stage. In one example, the I/O predriver stage comprises a driver predriver stage and wherein the I/O output stage comprises a driver output stage. In one example, the output stage has a voltage threshold to trigger transition between high and low output values of the output stage, where the control circuit is to provide a positive DC offset of an output of the predriver stage to cause the output stage to transition in response to lower relative predriver stage output values. In one example, the output stage has a voltage threshold to trigger transition between high and low output values of the output stage, where the control circuit is to provide a negative DC offset of an output of the predriver stage to cause the output stage to transition in response to higher relative predriver stage output values. In one example, the control circuit comprises a current source. In one example, the control circuit comprises separate positive DC bias and negative DC bias components. In one example, the control circuit comprises a feedforward loop with circuitry of the predriver stage to control the DC bias of the connection negatively responsive to predriver nonlinearity. In one example, the control circuit comprises a current source as a current mirror of a current source of the predriver stage. In one example, the apparatus further comprising: a duty cycle control inline with a current path of an output of the predriver stage. In one example, wherein the control circuit is to control the DC bias for a primary signal of a differential signal, and further comprising: a blending circuit to average duty cycles of the primary and complementary signals to align complementary edges of the primary and complementary signals. In one example, the I/O comprise a clock signal. In one example, the I/O comprise a data signal.

In general with respect to the descriptions herein, in one example a system includes: a memory device coupled to drive an input/output (I/O) signal line; and a memory controller coupled to receive a signal from the memory device on the I/O signal line, the memory controller in accordance with any example of the apparatus of the preceding two paragraphs. In general with respect to the descriptions herein, in one example a system includes: a memory device coupled to drive an input/output (I/O) signal line; and a memory controller coupled to receive a signal from the memory device on the I/O signal line; wherein the memory device is in accordance with any example of the apparatus of the preceding two paragraphs. In one example, the system further comprising one or more of: a host processor device coupled to the memory controller; a display communicatively coupled to a host processor; a network interface communicatively coupled to a host processor; or a battery to power the computing device.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus, comprising:
    an input/output (I/O) predriver stage;
    an I/O output stage to output a signal for communication with a remote device, the I/O output stage coupled to the predriver stage through a connection between the predriver stage and the output stage, the output stage to be driven by the predriver stage with an alternating current (AC) signal to generate a digital output; and
    a control circuit to control a direct current (DC) bias of the connection between the predriver stage and the output stage to provide trim adjustment of a duty cycle of the digital output of the output stage, wherein a change of the DC bias is to shift an intersection point of the AC signal with a transition voltage threshold at which the digital output is to transition from one logic value to another, to change the duty cycle of the digital output of the output stage.

2. The apparatus of claim 1, wherein the I/O predriver stage comprises an input buffer predriver stage and wherein the I/O output stage comprises an input buffer output stage to output a signal received from the remote device.

3. The apparatus of claim 1, wherein the I/O predriver stage comprises a driver predriver stage and wherein the I/O output stage comprises a driver output stage to output a signal to transmit to the remote device.

4. The apparatus of claim 1, wherein the control circuit is to provide a positive DC offset of an output of the predriver stage to cause the AC signal to cross the intersection point at a lower AC signal voltage to cause the output stage to transition in response to lower relative predriver stage output values.

5. The apparatus of claim 1, wherein the control circuit is to provide a negative DC offset of an output of the predriver stage to cause the AC signal to cross the intersection point at a higher AC signal voltage to cause the output stage to transition in response to higher relative predriver stage output values.

6. The apparatus of claim 1, wherein the control circuit comprises a current source.

7. The apparatus of claim 1, wherein the control circuit comprises separate positive DC bias and negative DC bias components.

8. The apparatus of claim 1, wherein the control circuit comprises a feedforward loop with circuitry of the predriver stage to control the DC bias of the connection negatively responsive to predriver nonlinearity.

9. The apparatus of claim 8, wherein the control circuit comprises a current source as a current mirror of a current source of the predriver stage.

10. The apparatus of claim 1, further comprising:
    a duty cycle control inline with a current path of an output of the predriver stage.

11. The apparatus of claim 1, wherein the control circuit is to control the DC bias for a primary signal of a differential signal, and further comprising:

a blending circuit to average duty cycles of the primary and complementary signals to align complementary edges of the primary and complementary signals.

12. The apparatus of claim 1, wherein the I/O output stage is to output a clock signal.

13. The apparatus of claim 1, wherein the I/O output stage is to output a data signal.

14. A system, comprising:
a memory device coupled to drive an input/output (I/O) signal line; and
a memory controller coupled to receive a signal from the memory device on the I/O signal line, the memory controller including an input buffer including:
a predriver stage;
an output stage coupled to the predriver stage through a connection between the predriver stage and the output stage, the output stage to be driven by the predriver stage; and
a control circuit to control a direct current (DC) bias of the connection between the predriver stage and the output stage to provide trim adjustment of a duty cycle of a digital output of the output stage, wherein a change of the DC bias is to change the duty cycle of the digital output of the output stage.

15. The system of claim 14, wherein the output stage has a voltage threshold to trigger transition between high and low output values of the output stage, where the control circuit is to
increase a DC offset of an output of the predriver stage to cause the output stage to transition in response to lower relative predriver stage output values, or,
decrease the DC offset of the output of the predriver stage to cause the output stage to transition in response to higher relative predriver stage output values.

16. The system of claim 14, wherein the control circuit comprises separate positive DC bias and negative DC bias components.

17. The system of claim 14, wherein the control circuit comprises a feedforward loop with circuitry of the predriver stage to control the DC bias of the connection negatively responsive to predriver nonlinearity.

18. The system of claim 14, further comprising:
a duty cycle control inline with a current path of an output of the predriver stage.

19. The system of claim 14, wherein the control circuit is to control the DC bias for a primary signal of a differential signal, and further comprising:
a blending circuit to average duty cycles of the primary and complementary signals to align complementary edges of the primary and complementary signals.

20. The system of claim 14, further comprising one or more of:
a host processor device coupled to the memory controller;
a display communicatively coupled to a host processor;
a network interface communicatively coupled to a host processor; or
a battery to power the system.

* * * * *